(12) United States Patent
Park et al.

(10) Patent No.: US 6,970,384 B2
(45) Date of Patent: Nov. 29, 2005

(54) PROGRAMMING METHOD OF FLASH MEMORY DEVICE

(75) Inventors: Dong-Ho Park, Gyeonggi-do (KR); Seung-keun Lee, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/893,585

(22) Filed: Jul. 16, 2004

(65) Prior Publication Data

US 2005/0141274 A1    Jun. 30, 2005

(30) Foreign Application Priority Data

Jul. 18, 2003 (KR) ............. 10-2003-0049136

(51) Int. Cl.[7] ............................................. G11C 16/04
(52) U.S. Cl. ..................... 365/185.28; 365/185.18; 365/185.19
(58) Field of Search ....................... 365/185.28, 185.18

(56) References Cited

U.S. PATENT DOCUMENTS

| | | | |
|---|---|---|---|
| 6,028,792 A * | 2/2000 | Tanaka et al. | 365/185.22 |
| 6,108,238 A * | 8/2000 | Nakamura et al. | 365/185.22 |
| 6,212,101 B1 | 4/2001 | Lee | |
| 6,459,614 B1 * | 10/2002 | Miwa et al. | 365/185.03 |
| 6,538,923 B1 * | 3/2003 | Parker | 365/185.03 |

* cited by examiner

Primary Examiner—Anh Phung
(74) Attorney, Agent, or Firm—Marger Johnson & McCollom, P.C.

(57) ABSTRACT

Provided is a programming method of a flash memory device. The method includes programming a memory cell for a first programming time, detecting whether or not the memory cell is programmed and terminating a first programming period when it is detected that the memory cell is programmed, determining whether or not the first programming period is terminated when it is detected that the memory cell is not programmed, repeating programming for a first programming time, detecting, and determining until the first programming period is terminated, programming the memory cell for a second programming time, detecting whether or not the memory cell is programmed and terminating a second programming period when it is detected that the memory cell is programmed, determining whether or not the second programming period is terminated when it is detected that the memory cell is not programmed, and repeating programming for a second programming time, detecting, and determining until the second programming time is terminated.

12 Claims, 4 Drawing Sheets

PROGRAMMING METHOD OF FLASH MEMORY DEVICE

BACKGROUND OF THE INVENTION

This application claims priority from Korean Patent Application No. 2003-49136, filed on Jul. 18, 2003, in the Korean Intellectual Property Office, the disclosure of which is incorporated herein in its entirety by reference.

1. Field of the Invention

This disclosure relates to a semiconductor device, and more particularly, to a programming method of a flash memory device.

2. Description of the Related Art

In general, a flash memory device is a kind of nonvolatile electrically erasable and programmable memory device, which does not have to be refreshed.

The flash memory device can be categorized as either NOR or NAND type. As compared with other nonvolatile memory devices, a NOR type flash memory device performs programming and reading operations at very high speed and thus is attracting more attention from users requiring high-speed devices.

FIG. 1 is a cross-sectional view of a memory cell of a NOR type flash memory device. Referring to FIG. 1, a memory cell 10 includes a p-type substrate 11, an n-type source region 12, an n-type drain region 13, a floating gate 14, and a control gate 15. A channel region 16 is disposed between the source region 12 and the drain region 13. The floating gate 14 is disposed over the channel region 16 and insulated by an insulating film 17. The control gate 15 is disposed over the floating gate 14 and insulated by another insulating film 18.

Programming of the memory cell 10 involves injecting hot electrons from the channel region 16 adjacent to the drain region 13 into the floating gate 14.

Typically, the injection of hot electrons entails a two stage process. In the first stage, the source region 12 and the substrate 11 are grounded. In the second stage, a high voltage (e.g., 10 V) is applied to a control gate electrode Vg, and an appropriate voltage (e.g., 5V –6V) for generating hot electrons is applied to the drain region 13.

This programming of the memory cell 10 allows sufficient negative electric charges to accumulate in the floating gate 14. Thus, negative (–) electric potential of the floating gate 14 leads to an increase in the threshold voltage of the memory cell 10 during a series of reading operations.

Reading operation is implemented by applying an appropriate voltage (e.g., 1 V) to the drain region 13 of the memory cell 10, applying a predetermined voltage (e.g., 4.5 V) to the control gate electrode Vg, and applying 0 V to the source region 12.

During the reading operation, the memory cell 10, having the increased threshold voltage due to the programming, prevents injection of currents from the drain region 13 into the source region 12. That is, the memory cell 10 is in a turn-off state.

As shown in FIG. 2, the threshold voltage Vth_cell of the programmed memory cell 10 is typically in the range from about 6 V to 7 V.

Also, the memory cell 10 is erased through Fowler-Nordheim (F-N) tunneling from the floating gate 14 into the substrate 11. This F-N tunneling is enabled by applying a high negative voltage to the control gate electrode Vg and applying an appropriate positive voltage to the substrate 11. This erasing method allows negative electric charges to discharge from the floating gate 14 into the substrate (i.e., a bulk region) 11. Thus, the threshold voltage Vth_cell of the erased memory cell is lowered during the reading operation.

In the memory cell 10 having the reduced threshold voltage Vth_cell due to the erasing operation, if a certain voltage is applied to the control gate electrode Vg during the reading operation, a current path from the drain region 13 into the source region 12 is formed. That is, the memory cell 10 is in a turn-on state. As shown in FIG. 2, the threshold voltage Vth_cell of the erased memory cell is typically in the range from about 1 V to 3 V.

The programming and erasing of the memory cell 10 are performed by externally applied commands. After the memory cell 10 is programmed, it is detected whether the threshold voltage Vth_cell of the programmed cell is in the range of a target threshold voltage. If the threshold voltage Vth_cell of the programmed cell does not approximate a target value, the memory cell 10 is programmed again.

Also, if it is detected that the threshold voltage Vth_cell of the erased memory cell 10 deviates from the range of the target threshold voltage, the memory cell 10 is erased again or an over-erase repair method is performed such that the threshold voltage Vth_cell of the erased memory cell 10 is in the range of the target threshold voltage.

Programming the memory cell 10 is time consuming, and, although research has been undertaken to reduce the programming time, no adequate solutions yet exist.

Embodiments of the invention address this and other limitations of the prior art.

SUMMARY OF THE INVENTION

Embodiments of the present invention provide a method of programming a flash memory device, which reduces a time taken to program a memory cell in the flash memory device.

BRIEF DESCRIPTION OF THE DRAWINGS

The above features and advantages of the present invention will become more apparent by describing in detail exemplary embodiments thereof with reference to the attached drawings in which.

DETAILED DESCRIPTION OF THE INVENTION

Figure 1:
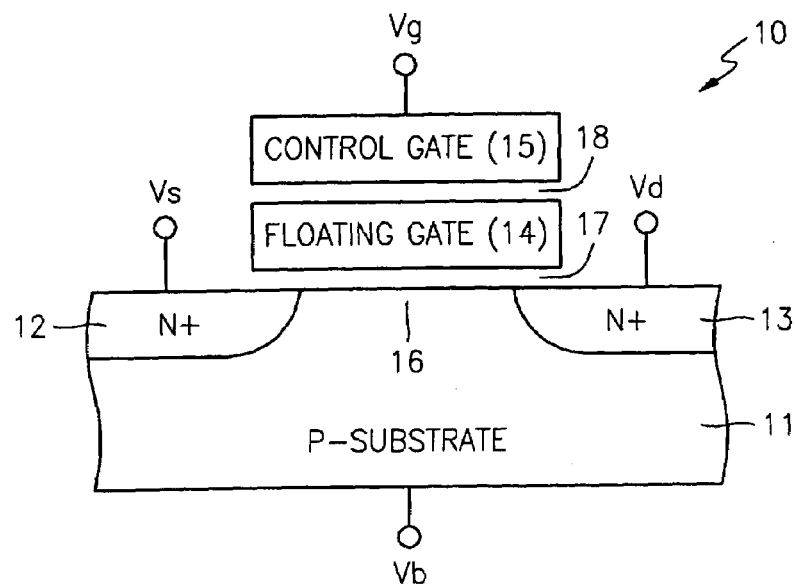
FIG. 1 is a cross-sectional view of a memory cell of a NOR type flash memory device.
Figure 2:
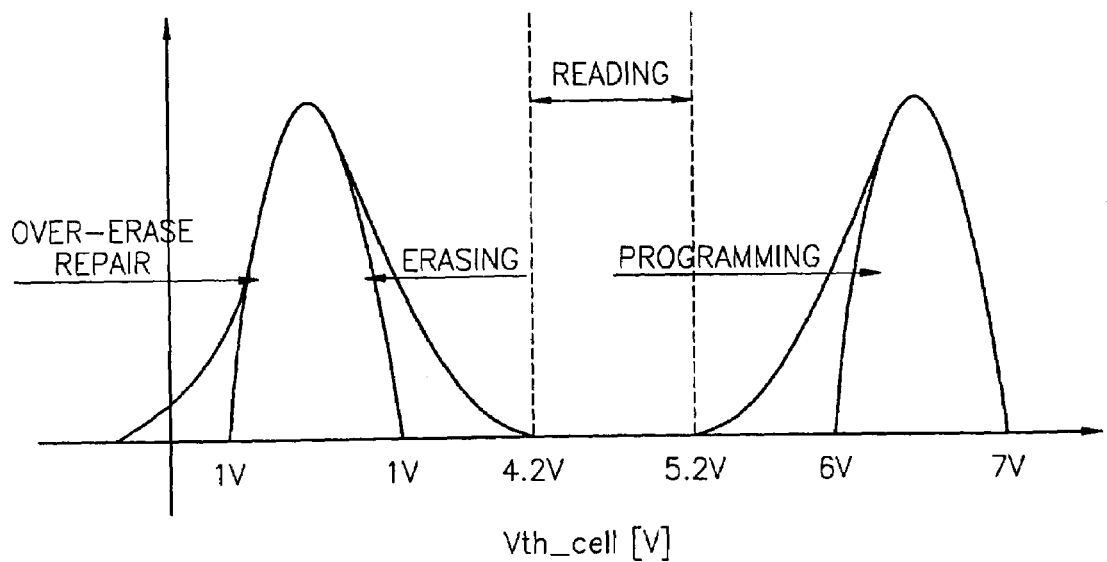
FIG. 2 is a graph depicting a variation of the threshold voltage of the memory cell shown in FIG. 1.

Embodiments of the present invention will now be described more fully with reference to the accompanying drawings, in which exemplary embodiments of the invention are shown. The same reference numerals are used to denote the same elements throughout the drawings.

Hereinafter, a programming method of a flash memory device according to embodiments of the present invention will be described with reference to FIG. 3.

Initially, a step variable STEP is set to 1, and an initial programming voltage is set (process 31). The step variable STEP refers to a variable for counting the number of programming iterations. The programming voltage refers to a voltage applied to a word line during programming of a memory cell.

Next, a predetermined programming voltage is applied to a word line for a first programming time to program a memory cell (process 32). A voltage, appropriate for programming the memory cell, is applied to a bit line.

Programming is performed for the first programming time corresponding to a first programming period. It is detected whether or not the memory cell is programmed at a desired threshold voltage (process 33). The detection may be performed after a programming step is terminated.

It is determined whether or not the programming was successful (process 34). If it is determined that the memory cell is programmed, the programming of the memory cell ends in success (process 42). If it is determined that the memory cell is not programmed, i.e., the detection of programming is not passed, it is determined whether or not the first programming period is terminated (process 35).

Whether or not the first programming period is terminated is determined by deciding if the step variable STEP is equal to a first predetermined number, CV1. That is, if the step variable STEP is less than the first predetermined number CV1, i.e., if the first programming period is not terminated, the step variable STEP is increased by 1 and the programming voltage applied to the word line is increased by a predetermined value (process 36). Then, this process is returned to process 32.

In this manner, the programming processes of the first programming period are performed by increasing the step variable STEP and the programming voltage Vpgm for each programming process until the first programming period is terminated.

In process 35, if the step variable STEP is equal to the first predetermined number CV1, i.e., if the first programming period is terminated, the step variable STEP is increased by 1 and the programming voltage applied to the word line is increased by a predetermined value (process 37).

Thereafter, the programming voltage is applied to the word line for a second programming time to program the memory cell (process 38). Processes performed for the second programming time correspond to a second programming period.

It is detected whether or not the memory cell is programmed at a desired threshold voltage (process 39). It is determined whether the programming was successful (process 40). If it is determined that the detection of programming is passed, the programming of the memory cell ends in success (process 42). If it is determined that the memory cell is not programmed, i.e., the detection of programming is not passed, it is determined whether or not the second programming period is terminated (process 41).

Whether or not the second programming period is terminated is determined by deciding if the step variable STEP is equal to a second predetermined number, CV2. If the step variable STEP is less than the second predetermined number CV2, i.e., if the second programming period is not terminated, the process continues at process 37.

In this manner, the programming processes of the second programming period are performed by increasing the step variable STEP and the programming voltage for each programming process until the second programming period is terminated. However, when the step variable STEP is equal to the second predetermined number CV2 in process 41, i.e., the second programming period is terminated, the programming of the memory cell ends in failure (process 43).

The result of failure is that the threshold voltage of the memory cell does not approximate a target value even if all the programming processes are performed.

As described above, the programming method of embodiments of the present invention can include a number of programming processes, which are divided into two periods, i.e., the first programming period and the second programming period. Processes 31 through 35 belong to the first programming period, and processes 37 through 41 belong to the second programming period. Preferably, each process of the second programming period takes a shorter programming time than each step of the first programming period.

Figure 3:
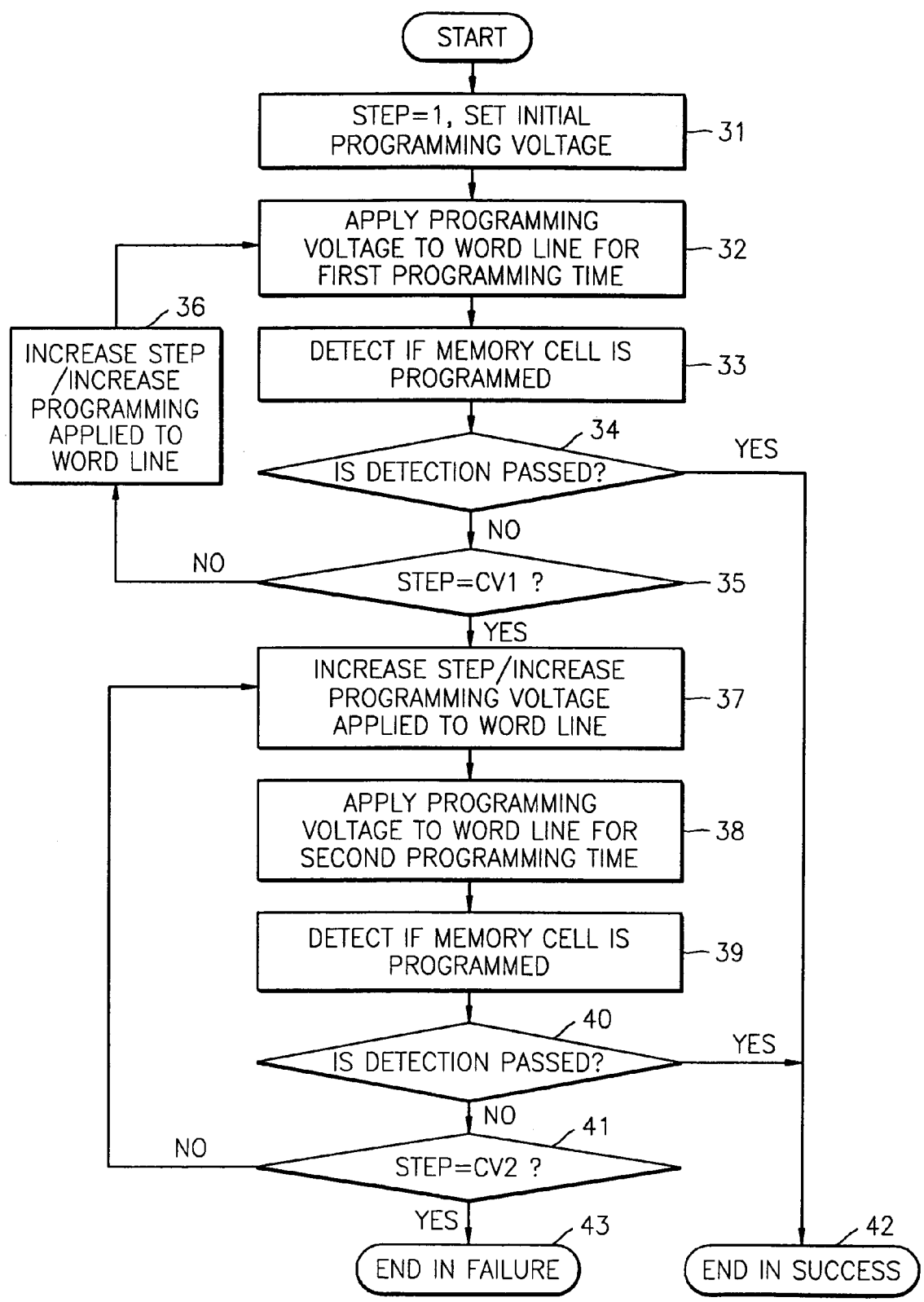
FIG. 3 is a flowchart showing an example programming method of a flash memory device according to an embodiment of the present invention.
Figure 4:
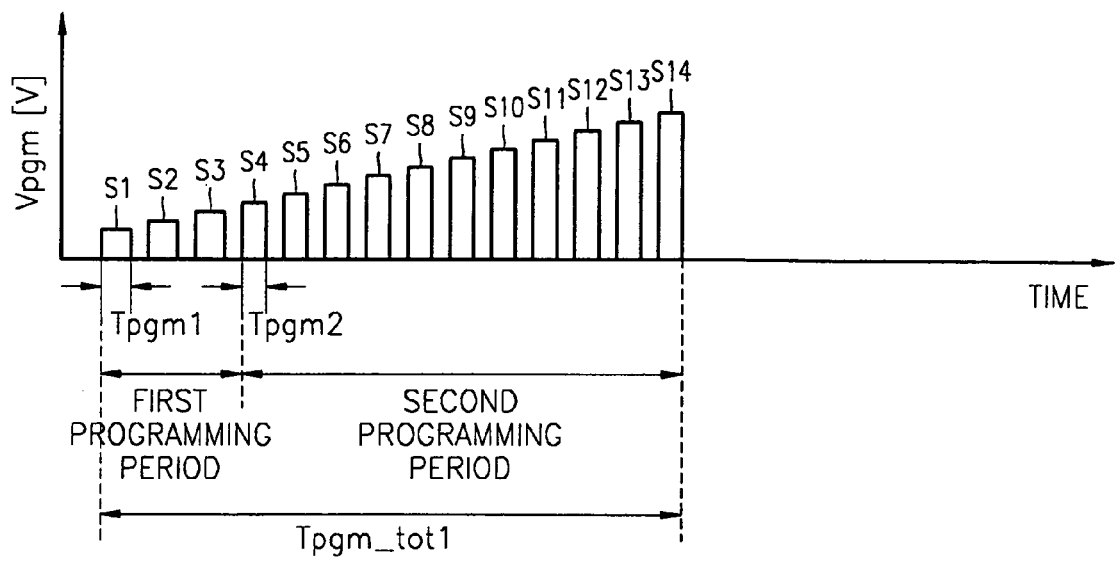
FIG. 4 is a graph depicting the programming method shown in FIG. 3 in more detail.

FIG. 4 is a graph depicting an example of using the programming method shown in FIG. 3 in more detail. Referring to FIG. 4, a memory cell is programmed through fourteen programming steps. A first programming step (S1) through a third programming step (S3) belong to a first programming period, and a fourth programming step (S4) through a fourteenth programming step (S14) belong to a second programming period.

As shown in FIG. 4, whenever one programming step is performed, the programming voltage (Vpgm) applied to a word line is increased by a predetermined value. Optionally, the predetermined value may be constant. As illustrated, the variable STEP is equal to a second predetermined number (CV2 of FIG. 3) at the fourteenth programming step (S14).

Accordingly, in this example, a first predetermined number (CV1 of FIG. 3) is 3. Each of the first through third programming steps (S1–S3) takes a programming time of Tpgm1, and each of the fourth through fourteenth programming steps (S4–S14) takes a programming time of Tpgm2 (<Tpgm1).

Figure 5:
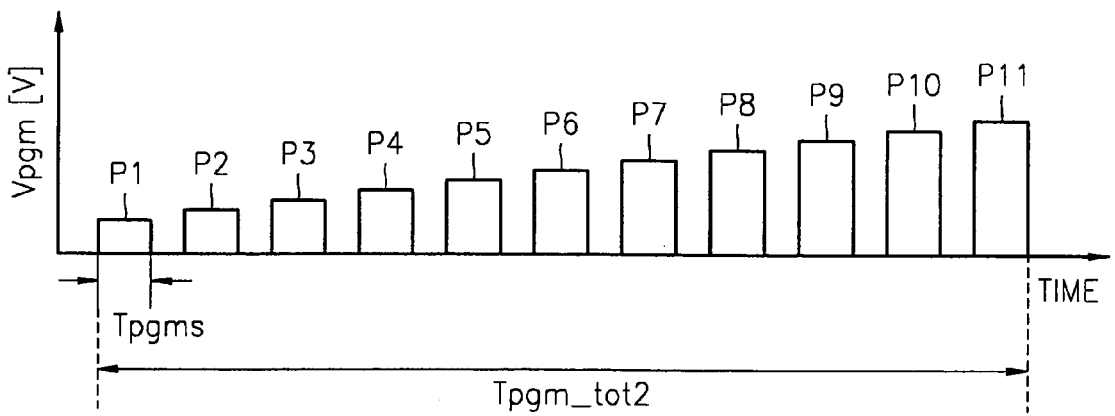
FIG. 5 is a graph depicting a programming method of a flash memory device and another programming method.

FIG. 5 is a graph depicting a programming method of a flash memory device according to a contrastive example to the present invention. In the method shown in FIG. 5, a memory cell is programmed through eleven programming steps, and whenever each programming step is performed, a programming voltage Vpgm applied to a word line is increased.

However, in the method shown in FIG. 5, each of first through eleventh programming steps (P1–P11) takes a constant programming time of Tpgm. The programming time Tpgm of each step shown in FIG. 5 is longer than the first programming time Tpgm 1 or the second programming time Tpgm2 shown in FIG. 4.

Figure 6:
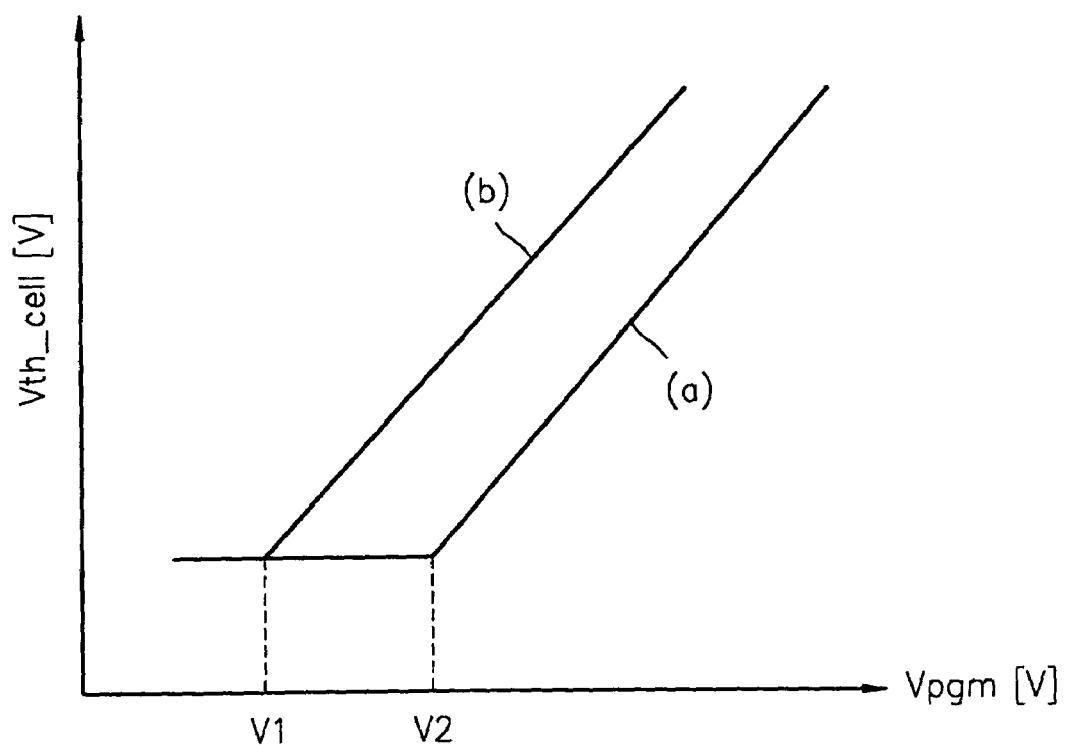
FIG. 6 is a graph depicting the threshold voltage of a memory cell versus the programming voltage when the programming methods of FIGS. 4 and 5 each are applied.

FIG. 6 is a graph depicting the threshold voltage Vth_cell of a memory cell versus the programming voltage Vpgm when the programming methods of FIGS. 4 and 5 each are applied. Line (a) is obtained by applying the programming method shown in FIG. 4, and line (b) is obtained by applying the programming method shown in FIG. 5.

Referring to the lines (a) and (b) of FIG. 6, whenever one programming step is performed, the programming voltage Vpgm is increased. As the programming voltage Vpgm increases, the threshold voltage Vth_cell of the memory cell is linearly proportional to the programming voltage Vpgm.

As shown in the line (b) of FIG. 6, if the programming time Tpgm of each programming step is relatively long, the threshold voltage Vth_cell of the memory cell increases linearly with the programming voltage Vpgm.

On the other hand, as shown in the line (a) of FIG. 6, where the method described in FIG. 4 is used to shorten the programming time Tpgm, the threshold voltage Vth_cell of the memory cell hardly varies during initial programming steps and then begins linearly increasing in proportion to the programming voltage Vpgm.

The slope of the line (a) is almost the same as that of the line (b). Hence, although initial programming steps are performed until the threshold voltage Vth_cell of the memory cell begins linearly increasing in proportion to the programming voltage Vpgm, since each of the programming times Tpgm1 or Tpgm2 is relatively short, the overall programming time can decrease.

For example, it is supposed that the programming time Tpgm of each programming step is 5T in FIG. 5 and the first and second programming times Tpgm1 and Tpgm2 are 2T' and T', respectively, in FIG. 4.

In FIG. 4, it is supposed that the threshold voltage Vth_cell of the memory cell hardly varies during the first through third programming steps (S1–S3 of FIG. 4) and then begins linearly increasing in proportional to the programming voltage Vpgm in the fourth programming step S4 such that the memory cell is programmed after the fourteenth programming step (S14).

In FIG. 5, although the number of programming steps is smaller than in FIG. 4, the overall programming time (Tpgm_tot2) is longer than that (Tpgm_tot1) shown in FIG. 4. Thus, when the method as illustrated in FIG. 4 is used, it decreases the overall programming time to thereby improve the operating speed of the flash memory device.

Of course, the invention can be practiced in a number of ways without deviating from the inventive aspects. Particular embodiments are given below without limitation.

According to an aspect of the present invention, there a method of programming a flash memory device includes: (a) programming a memory cell by applying a programming voltage to a word line for a first programming time; (b) detecting whether the memory cell is programmed; (c) terminating the programming if it is detected that the memory cell is programmed and determining whether a first programming period is terminated if it is detected that the memory cell is not programmed; (d) returning to step (a) if the first programming period is not terminated and entering into step (e) if the first programming period is terminated; (e) programming the memory cell for a second programming time and detecting whether or not the memory cell is programmed; (f) terminating the programming if it is detected that the memory cell is programmed and determining whether or not a second programming period is terminated if it is detected that the memory cell is not programmed; and (g) returning to step (e) if the second programming period is not terminated.

According to another aspect of the present invention, there is provided a programming method of a flash memory device, including: (a) dividing a number of programming steps into a first programming period and a second programming period; (b) programming a memory cell for a first programming time during each of the programming steps belonging to the first programming period among the plurality of programming steps; and (c) programming the memory cell for a second programming time during each of the programming steps belonging to the second programming period among the plurality of programming steps.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A method of programming a flash memory device, comprising:
   programming a memory cell for a first programming time;
   detecting whether or not the memory cell is programmed and terminating a first programming period when it is detected that the memory cell is programmed;
   determining whether or not the first programming period is terminated when it is detected that the memory cell is not programmed;
   repeating programming for a first programming time, detecting, and determining until the first programming period is terminated;
   programming the memory cell for a second programming time;
   detecting whether or not the memory cell is programmed and terminating a second programming period when it is detected that the memory cell is programmed;
   determining whether or not the second programming period is terminated when it is detected that the memory cell is not programmed; and
   repeating programming for a second programming time, detecting, and determining until the second programming time is terminated.

2. The programming method of claim 1, wherein the flash memory device is a NOR type flash memory device.

3. The programming method of claim 1, further comprising increasing the programming voltage before repeating programming for a first programming time or a second programming time.

4. The programming method of claim 1, wherein the first programming time is shorter than the second programming time.

5. The programming method of claim 1, wherein the first programming time is equal to or longer than the second programming time.

6. The programming method of claim 1, wherein the memory cell is programmed by applying a voltage to a word line.

7. A method of programming a flash memory device, comprising:
   dividing a plurality of programming steps into at least a first programming period and a second programming period;
   programming a memory cell for a first programming time during each of the programming steps belonging to the first programming period; and
   programming the memory cell for a second programming time during each of the programming steps belonging to the second programming period.

8. The programming method of claim 7, wherein the flash memory device is a NOR type flash memory device.

9. The programming method of claim 7, further comprising detecting whether or not the memory cell is programmed.

10. The programming method of claim 7, wherein the first programming time is shorter than the second programming time.

11. The programming method of claim 7, wherein the first programming time is equal to or longer than the second programming time.

12. The programming method of claim 7, wherein the memory cell is programmed by applying a voltage to a word line.

* * * * *